(12) United States Patent
Mouret et al.

(10) Patent No.: US 10,135,434 B2
(45) Date of Patent: Nov. 20, 2018

(54) ELECTRONIC CIRCUIT FOR CONTROLLING A HALF H-BRIDGE

(71) Applicants: CONTINENTAL AUTOMOTIVE FRANCE, Toulouse (FR); CONTINENTAL AUTOMOTIVE GMBH, Hannover (DE)

(72) Inventors: Julien Mouret, Pamiers (FR); Christian Pradelles, Eaunes (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/548,696

(22) PCT Filed: Feb. 4, 2016

(86) PCT No.: PCT/EP2016/000181
§ 371 (c)(1),
(2) Date: Aug. 3, 2017

(87) PCT Pub. No.: WO2016/124334
PCT Pub. Date: Aug. 11, 2016

(65) Prior Publication Data
US 2018/0019746 A1 Jan. 18, 2018

(30) Foreign Application Priority Data
Feb. 4, 2015 (FR) ...................................... 15 50862

(51) Int. Cl.
*H03K 17/16* (2006.01)
*H03K 5/151* (2006.01)
*F02D 41/20* (2006.01)

(52) U.S. Cl.
CPC ......... *H03K 17/162* (2013.01); *H03K 5/1515* (2013.01); *F02D 41/2096* (2013.01);
(Continued)

(58) Field of Classification Search
None
See application file for complete search history.

(56) References Cited

U.S. PATENT DOCUMENTS

| | | | |
|---|---|---|---|
| 5,648,896 A * | 7/1997 | Mandelcorn | H02M 3/337 363/132 |
| 7,330,055 B2 * | 2/2008 | Bird | H02M 1/08 327/108 |
| 2009/0140791 A1 | 6/2009 | Young | |

FOREIGN PATENT DOCUMENTS

| EP | 0 251 910 A2 | 1/1988 |
|---|---|---|
| JP | H01-228319 A | 9/1989 |

OTHER PUBLICATIONS

International Search Report, dated Apr. 19, 2016, from corresponding PCT application No. PCT/EP2016/000181.

* cited by examiner

*Primary Examiner* — Jeffrey Zweizig
(74) *Attorney, Agent, or Firm* — Young & Thompson

(57) ABSTRACT

Disclosed is an electronic circuit for controlling a half H bridge, the half split H bridge including first and second MOSFET transistors of different respective types, with sources connected respectively to a supply line and to an electric mass, and with respective drains connected to a load. Moreover, the control circuit includes first and second bipolar transistors of different respective types, with collectors connected to the supply line and to the electric mass, respectively, and with respective bases connected to a control module for controlling the MOSFET transistors, as well as first and second arms mounted parallel relative to one (Continued)

another between the gates of the MOSFET transistors, connected to the emitter of the first bipolar transistor and of the second bipolar transistor, respectively, the first arm including a first diode and a first resistor, and the second arm including a second diode and a second resistor.

20 Claims, 3 Drawing Sheets

(52) U.S. Cl.
CPC ............... *F02D 2041/2072* (2013.01); *H03K 2217/0045* (2013.01); *H03K 2217/0063* (2013.01); *H03K 2217/0072* (2013.01)

ELECTRONIC CIRCUIT FOR CONTROLLING A HALF H-BRIDGE

BACKGROUND OF THE INVENTION

Field of the Invention

The present invention relates to an electronic circuit for controlling a half H-bridge. A particularly advantageous, although in no way limiting, application of the present invention is in half H-bridge control circuits that are embedded in motor vehicles and that manage the supply of power to a load, such as an actuator.

Description of the Related Art

Various electronic circuits for controlling an H-bridge currently exist. Such a circuit is generally intended to manage the supply of power to a load, arranged in the center of said H-bridge, the latter being configured such that a given current flows from one terminal to another of said load in order to bias it. In the case of a motor vehicle, such circuits are embedded for the purpose of managing injectors or self-synchronous motors, for example.

The assembly formed of the control circuit and of the H-bridge traditionally has a symmetrical structure, including two identical parts arranged on either side of the terminals of said load. Therefore, the description of the features of one of two said parts, furthermore including a half of the H-bridge, termed half H-bridge, is sufficient for understanding the features of said assembly.

The half H-bridge conventionally comprises two transistors that are linked to a terminal of said load, managed by a control module and designed to switch between an off-state and an on-state.

Several types of electronic circuit for controlling a half H-bridge operating in accordance with the general principle described above, in particular those including two MOSFET (metal-oxide-semiconductor field-effect transistor) transistors of the same type, are known. They also generally include two separate control modules that independently couple the respective gates of said MOSFET transistors to a power supply line, or to an electrical ground, by means of a plurality of electronic components. These components accordingly necessitate, in addition to a non-negligible PCB (printed circuit board) area relative to the device in which they are embedded, a complex routing diagram with a view to ensuring compliance with electromagnetic compatibility standards.

Document JP H01 228319 proposes, to simplify the structure of an integrated power circuit for controlling an H-bridge on the one hand and to reduce the losses of said integrated power circuit on the other hand, inserting a parallel electronic circuit formed of resistors and of diodes. The resistors and the diodes are coupled to the gate of each of the P-channel MOSFET and N-channel MOSFET transistors of the parallel electronic circuit. Thus, when an input signal Vin changes to a high level, the P-channel MOSFET transistor is deactivated and the N-channel MOSFET transistor is activated, causing an N-channel MOSFET transistor of the power circuit to switch from an on-state to an off-state, and a P-channel MOSFET transistor to switch from an off-state to an on-state. The switching of the transistors of the power circuit causes an output signal of the power circuit to change to a high level. By virtue of the presence of the resistors and of the diodes, the transistors of the power circuit do not switch simultaneously.

Circuits including less elaborate electronics also exist, such as for example those including two MOSFET transistors of different respective types and that are coupled to a power supply by means of a single controller. Although such a configuration permits a saving in PCB area and a simplification of the routing diagram, said circuits are however not suitable, on the one hand, for completely preventing transconductance effects between MOSFET transistors or, on the other hand, for raising the load to high impedance in the event of a fault with the controller.

BRIEF SUMMARY OF THE INVENTION

The aim of the present invention is to rectify all or some of the drawbacks of the prior art, in particular those mentioned above, by proposing a solution that makes it possible to have electronic circuits for controlling a half H-bridge including a load and MOSFET transistors, and that has a simple routing diagram that is suitable for preventing transconductance effects during the switching of said MOSFET transistors, and to raise said load to high impedance in the event of a controller fault.

To this end, the invention relates to an electronic circuit for controlling a half H-bridge, said half H-bridge including a first and a second MOSFET transistor of different respective types, with sources linked to a power supply line and to an electrical ground, respectively, and with respective drains linked to a center tap, said center tap being intended to be linked to a terminal of a load, said control circuit being designed to switch said MOSFET transistors from an on-state to an off-state, respectively. Said electronic circuit furthermore includes a first and a second bipolar transistor of different respective types, with emitters linked to a first node and to a second node, respectively, with collectors linked to the power supply line and to the electrical ground, respectively, and with respective bases linked to a third node, said third node being linked to a module, for controlling said MOSFET transistors, that may be configured in accordance with two states, a so-called 'high' state and a so-called low' state, and a first and a second branch that are mounted in parallel with respect to one another between the gates of said MOSFET transistors, the first branch including a first diode and a first resistor, the second branch including a second diode and a second resistor:

the first node being linked both to the first resistor and to the anode of the first diode of the first branch, said first resistor of the first branch furthermore being linked to the gate of the second MOSFET transistor, and the cathode of said first diode of the first branch being linked to the gate of the first MOSFET transistor, the second node being linked both to the second resistor and to the cathode of the second diode of the second branch, said second resistor of the second branch furthermore being linked to the gate of the first MOSFET transistor, and the anode of said second diode of the second branch being linked to the gate of the second MOSFET transistor.

In particular embodiments, the electronic circuit for controlling a half H-bridge may furthermore include one or more of the following features, taken alone or in any technically possible combination.

In one particular embodiment, the second branch includes a first auxiliary control module including a switch and a controller of said switch, said switch being designed to open and close the second branch between the second resistor and the second diode of said second branch, and the gate of the first transistor being linked to the power supply line by means of a third resistor.

In one particular embodiment, the switch of the second branch is a MOSFET transistor, with a drain linked to the second resistor of the second branch, with a gate linked to an output of said controller of the first auxiliary control module of the second branch, and with a source linked to the cathode of the second diode of the second branch.

In one particular embodiment, the first branch includes a second auxiliary control module including a switch and a controller of said switch, said switch being designed to open and close the first branch between the first resistor and the first diode of said first branch, and the gate of the second transistor being linked to the electrical ground by means of a fourth resistor.

In one particular embodiment, the switch of the first branch is a MOSFET transistor, with a drain linked to the first resistor of the first branch, with a gate linked to an output of said controller of the second auxiliary control module of the first branch, and with a source linked to the cathode of the first diode of the first branch.

In one particular embodiment, the collector of the first bipolar transistor is linked to the power supply line by means of a fifth resistor, and the collector of the second bipolar transistor is linked to the electrical ground by means of a sixth resistor.

In one particular embodiment, the control module includes a controller designed to generate voltage signals, and a MOSFET transistor, with a drain linked to the power supply line, with a gate linked to an output of the controller, and with a source linked both to said third node and to the electrical ground.

In one particular embodiment, a seventh resistor is arranged between the source of the MOSFET transistor of the control module and the electrical ground.

BRIEF DESCRIPTION OF THE DRAWINGS

The features and advantages of the invention will be better appreciated by virtue of the following description, which description describes the features of the invention through preferred embodiments that in no way limit the invention.

The description refers to the appended figures, in which.

DETAILED DESCRIPTION OF THE PREFERRED EMBODIMENTS

Figure 1:
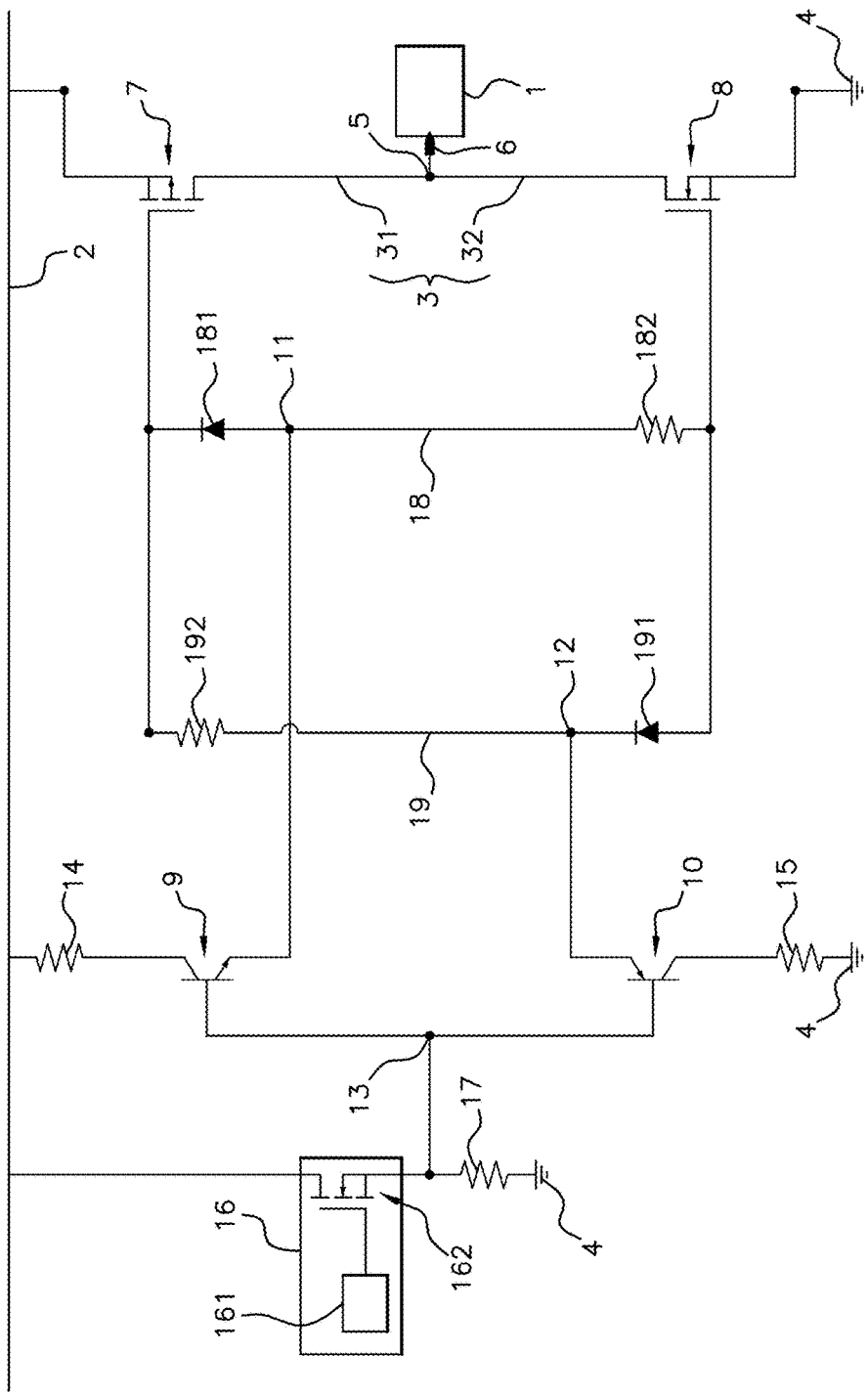
FIG. 1 shows a schematic representation of an exemplary embodiment of an electronic circuit for controlling a half H-bridge.

FIG. 1 schematically shows an exemplary embodiment of an electronic circuit for controlling a half H-bridge.

Said electronic circuit is used to control a half H-bridge (the other half of the H-bridge not being shown) linked to a load 1. Said load 1 is designed to be coupled to a power supply line 2 of predefined potential and that delivers a predefined current.

In the present case, and by way of in no way limiting example, the electronic control circuit is borne by a PCB embedded in a motor vehicle (not shown). Said half H-bridge controls a load 1, such as an injector actuator, and said power supply line 2 is linked to the battery of said vehicle.

Said half H-bridge includes a power supply branch 3 linked, on the one hand, to the power supply line 2 and, on the other hand, to an electrical ground 4, said electrical ground 4 corresponding to a reference potential. In the present exemplary embodiment, said electrical ground 4 is the metal body of the motor vehicle, for example, and corresponds to a zero potential.

Said power supply branch 3 includes a center tap 5 linked to a terminal 6 of the load 1. Said power supply branch 3 is thus divided into two parts that are arranged on either side of said center tap 5, a first part and a second part including a first MOSFET transistor 7 and a second MOSFET transistor 8, respectively, said MOSFET transistors being of different respective types.

In the nonlimiting example illustrated by FIG. 1, the first MOSFET transistor 7 is of the P-channel type, with a source linked to the power supply line 2 and with a drain linked to the center tap 5. The second MOSFET transistor 8, for its part, is of the N-channel type, with a source linked to the electrical ground 4 and with a drain linked to the center tap 5.

The control circuit also includes a first bipolar transistor 9 and a second bipolar transistor 10, said bipolar transistors being of different respective types. The first bipolar transistor 9 has an emitter linked to a first node 11, a collector linked to the power supply line 2, a base linked to a third node 13, and is designed to channel the current from the power supply line 2 to the gates of the MOSFET transistors of the half H-bridge. The second bipolar transistor 10, for its part, has an emitter linked to a second node 12, a collector linked to the electrical ground 4, a base linked to said third node 13, and is designed to channel the gate currents of the MOSFET transistors to the electrical ground 4.

In the nonlimiting example illustrated by FIG. 1, the first bipolar transistor 9 is of the NPN type, and the second bipolar transistor 10 is of the PNP type.

In one particular embodiment, illustrated in no way limitingly by FIG. 1, the collector of the first bipolar transistor 9 is linked to a first so-called 'power supply' resistor 14, the latter furthermore being linked to the power supply line 2 and designed to limit the current channeled to said collector of the first bipolar transistor 9. The collector of the second bipolar transistor 10, for its part, is linked to a first so-called 'return' resistor 15, the latter furthermore being linked to the electrical ground 4 and designed to limit any electrical flow returning to said electrical ground 4.

Moreover, the control circuit includes a module 16 for controlling the MOSFET transistors of the half H-bridge. Said control module 16 includes, firstly, a controller 161 designed to generate voltage signals and that may be configured in accordance with two states, a so-called 'high' state and a so-called low' state, corresponding to a high-voltage signal and to a low-voltage signal, respectively. For example, and in no way limitingly, said controller 161 is a microcontroller designed to supply voltages of 0 volts and 5 volts when it is configured in the low state and the high state, respectively.

Secondly, the control module 16 includes a MOSFET transistor 162, with a drain linked to the power supply line 2, and with a gate linked to an output of the controller 161, such that said gate is biased by the high voltage or the low voltage depending on the state of said controller 161. In addition, the source of the MOSFET transistor 162 of the control module 16 is linked both to said third node 13 and to the electrical ground 4.

In the nonlimiting example illustrated by FIG. 1, the MOSFET transistor 162 of the control module 16 is of the N-channel type.

In one particular embodiment, illustrated in no way limitingly by FIG. 1, a second return resistor 17 is arranged between the source of the MOSFET transistor 162 of the control module 16 and the electrical ground 4.

The control circuit includes a first 18 and a second 19 branch, which are mounted in parallel between the gates of the MOSFET transistors of the half H-bridge and each include a diode 181, 191 and a resistor 182, 192 that are mounted in series.

As illustrated in FIG. 1, the first node 11 is linked both to the resistor 182 and to the anode of the diode 181 of the first branch 18. Said resistor 182 of the first branch 18 is furthermore linked to the gate of the second MOSFET transistor 8. The cathode of said diode 181 of the first branch 18, for its part, is linked to the gate of the first MOSFET transistor 7. The second node 12, for its part, is linked both to the resistor 192 and to the cathode of the diode 191 of the second branch 19. Said resistor 192 of the second branch 19 is furthermore linked to the gate of the first MOSFET transistor 7. The anode of said diode 191 of the second branch 19, for its part, is linked to the gate of the second MOSFET transistor 8.

In a first operating mode, and with reference to FIG. 1, the controller 161 is configured in the high state, such that the gate of the MOSFET transistor 162 of the control module 16 is biased by the high voltage. Said MOSFET transistor 162 of the control module 16 then switches to the on-state on account of the fact that it is of the N-channel type and that the potential difference between its gate and its source is strictly positive. Accordingly, the third node 13, and then the respective bases of the first 9 and second 10 bipolar transistors, are coupled to the power supply line 2, such that only the first bipolar transistor 9, on account of the fact that it is of the NPN type and that the potential difference between its base and its emitter is strictly positive, switches to the on-state. The first node 11, and then the respective gates of the first 7 and second 8 MOSFET transistors, are thus coupled to the power supply line 2, such that only said second MOSFET transistor 8 switches to the on-state, on account of the fact that it is of the N-channel type. In this way, the center tap 5, linked to the terminal 6 of the load 1, is coupled to the electrical ground 4.

In a second operating mode, the controller 161 is configured in the low state, such that the gate of the MOSFET transistor 162 of the control module 16 is biased by the low voltage. Said MOSFET transistor 162 of the control module 16 then switches to the off-state on account of the fact that it is of the N-channel type and that the potential difference between its gate and its source is zero. Accordingly, the third node 13, and then the second node 12, are coupled to the electrical ground 4. The respective gates of the first 7 and second 8 MOSFET transistors are then coupled to the electrical ground 4. The first MOSFET transistor 7 thus switches to the on-state on account of the fact that it is of the P-channel type and that the potential difference between its gate and its source is strictly negative. The second MOSFET transistor 8, for its part, switches to the off-state on account of the fact that it is of the N-channel type and that the potential difference between its gate and its source is zero. In this way, the center tap 5, linked to the terminal 6 of the load 1, is coupled to the power supply line 2.

In accordance with the features of the first operating mode, it is clear that when the controller 161 is configured in the low state again, consecutively to the second operating mode, the first 7 and second 8 MOSFET transistors switch to the on-state and to the off-state, respectively. Accordingly, it will be understood that the configuration of the control circuit is advantageously designed such that the first 7 and second 8 MOSFET transistors are not simultaneously in the on-state.

Moreover, the arrangement of the diodes 181, 191 and resistors 182, 192 of the first 18 and second 19 branches is advantageous as it makes it possible to limit the effects of transconductance between the first 7 and second 8 MOSFET transistors when the latter switch.

Specifically, a MOSFET transistor, between its gate and its source, may be likened to a capacitor. Accordingly, assuming that the potential on the source of a MOSFET transistor remains constant, said capacitor charges and discharges depending on the potential to which the gate of said MOSFET transistor is linked, said charging/discharging corresponding to an increase/decrease in the absolute value of the potential difference between the gate and the source.

In the first operating mode, the gate and the source of the first MOSFET transistor 7 are both linked to the power supply line 2. Moreover, the gate and the source of the second MOSFET transistor 8 are linked to the power supply line 2 and to the electrical ground 4, respectively. Thus, in a scenario where the first 7 and second 8 MOSFET transistors are initially in the on-state and in the off-state, respectively, the second MOSFET transistor 8 charges through the resistor 182 of the first branch 18, whereas the first MOSFET transistor 7 discharges through the diode 181 of the first branch 18, which has a negligible equivalent resistance. As a result, the time constant associated with the discharging of the first MOSFET transistor 7 is negligible in comparison with the time constant associated with the charging of the second MOSFET transistor 8. In other words, the first MOSFET transistor 7 discharges more quickly than the second MOSFET transistor 8 charges, such that the first MOSFET transistor 7 switches to the off-state before the second MOSFET transistor 8 switches to the on-state.

In the second operating mode, the gate and the source of the second MOSFET transistor 8 are both linked to the electrical ground 4. Moreover, the gate and the source of the first MOSFET transistor 7 are linked to the electrical ground 4 and to the power supply line 2, respectively. Thus, in a scenario where the first 7 and second 8 MOSFET transistors are initially in the off-state and in the on-state, respectively, the first MOSFET transistor 7 charges through the resistor 192 of the second branch 19, whereas the second MOSFET transistor 8 discharges through the diode 191 of the second branch 19, which has a negligible resistance. As a result, the time constant associated with the discharging of the second MOSFET transistor 8 is negligible in comparison with the time constant associated with the charging of the first MOSFET transistor 7. In other words, the second MOSFET transistor 8 discharges more quickly than the first MOSFET transistor 7 charges, such that the second MOSFET transistor 8 switches to the off-state before the first MOSFET transistor 7 switches to the on-state.

Figure 2:
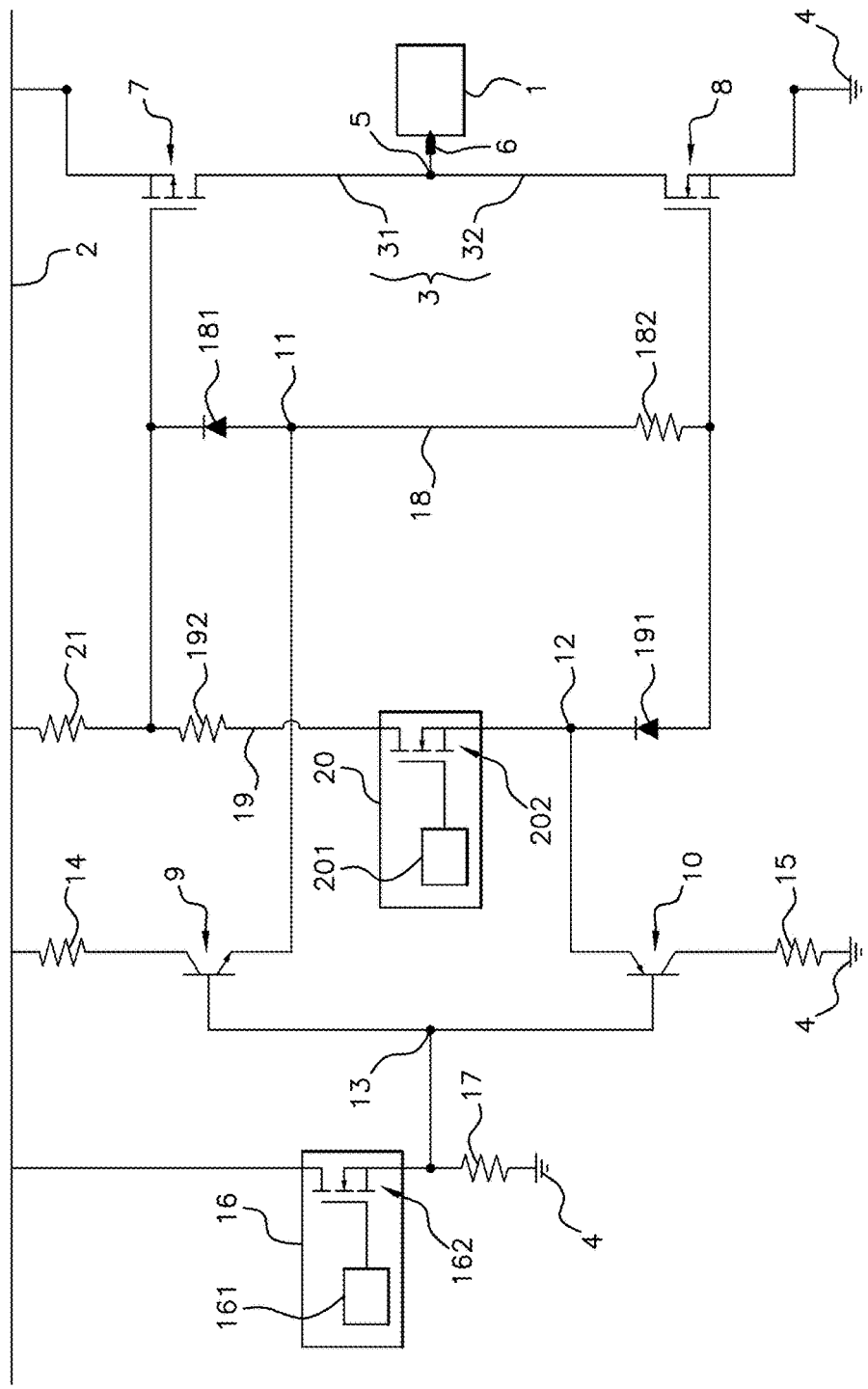
FIG. 2 shows a schematic representation of a first preferred embodiment of the circuit of FIG. 1.

FIG. 2 schematically shows a first preferred embodiment of the electronic circuit for controlling the half H-bridge of FIG. 1, in which the second branch 19 includes an auxiliary control module 20. Said auxiliary control module 20 includes a switch 202 and a controller 201 of said switch 202, said switch 202 being designed to open and close the second branch 19 between the resistor 192 and the diode 191 of said second branch 19. Furthermore, the gate of the first transistor 7 is linked to the power supply line 2 by means of a resistor 21. For example, in said first preferred embodiment, said switch of the second branch 19 is a MOSFET transistor 202. The controller 201 of said MOSFET transistor 202 is designed to generate voltage signals and may be configured in accordance with two states, a so-called 'high' state and a so-called low' state, corresponding to a high-voltage signal and to a low-voltage signal, respectively. Moreover, said MOSFET transistor 202 of said auxiliary control module 20 has a drain linked to the resistor 192 of the second branch 19, a gate linked to an output of said controller 201 of the auxiliary control module 20 of the second branch 19, and a source linked to the cathode of the diode 191 of the second branch 19.

In the nonlimiting example illustrated by FIG. 2, the MOSFET transistor 202 of the auxiliary control module 20 is of the N-channel type.

In one particular embodiment, the controller 201 of the auxiliary control module 20 of the second branch 19 is common with the controller 161 of the control module 16, such that the switch 202 of said auxiliary control module 20 is able to be controlled by the controller 161 of the control module 16.

Such a configuration of the circuit for controlling the half H-bridge is advantageous as it is suitable for raising the load 1 to high impedance in the event of a fault with the controller 161 of the control module 16 in the case of the second operating mode.

Specifically, first of all, when the controller 201 of the auxiliary control module 20 of the second branch 19 is in the high state, the MOSFET transistor 202 of said auxiliary control module 20 is in the on-state, such that the electronic control circuit of FIG. 2 behaves like the electronic control circuit of FIG. 1 in the second operating mode.

Secondly, in the event of a fault with the controller 161 of the control module 16 during the second operating mode, the controller 201 of the auxiliary control module 20 of the second branch 19 is placed in the low state, such that the MOSFET transistor 202 of said auxiliary control module 20 switches to the off-state. The gate of the first MOSFET transistor 7 is thus linked to the power supply line 2, such that the first MOSFET transistor 7 switches to the off-state. Insofar as the second MOSFET transistor 8 is itself also in the off-state, the load 1 is raised to high impedance.

Figure 3:
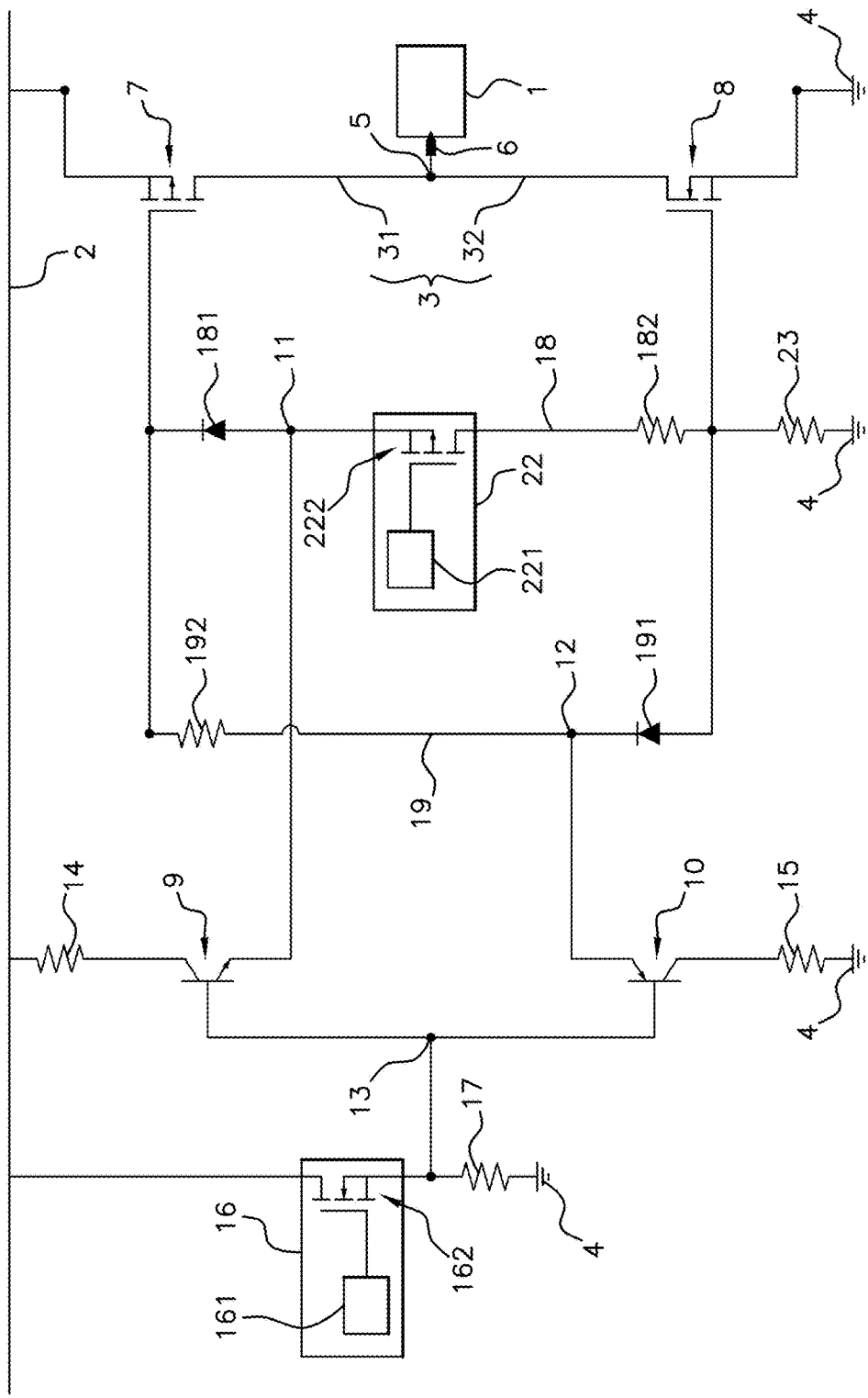
FIG. 3 shows a schematic representation of a second preferred embodiment of the circuit of FIG. 1.

FIG. 3 schematically shows a second preferred embodiment of the electronic circuit for controlling the half H-bridge of FIG. 1, in which the first branch 18 includes an auxiliary control module 22. Said auxiliary control module 22 includes a switch 222 and a controller 221 of said switch 222, said switch 222 being designed to open and close the first branch 18 between the resistor 182 and the diode 181 of said first branch 18. Furthermore, the gate of the second transistor 8 is linked to the electrical ground 4 by means of a resistor 23.

For example, in said second preferred embodiment, said switch of the first branch 18 is a MOSFET transistor 222. The controller 221 of said MOSFET transistor 222 is designed to generate voltage signals and may be configured in accordance with two states, a so-called 'high' state and a so-called low' state, corresponding to a high-voltage signal and to a low-voltage signal, respectively. Moreover, said MOSFET transistor 222 of said auxiliary control module 22 has a drain linked to the resistor 182 of the first branch 18, a gate linked to an output of said controller 221 of the auxiliary control module 20 of the first branch 18, and a source linked to the cathode of the diode 181 of the first branch 18.

In the nonlimiting example illustrated by FIG. 3, the MOSFET transistor 222 of the auxiliary control module 22 is of the P-channel type.

In one particular embodiment, the controller 221 of the auxiliary control module 22 of the first branch 18 is common with the controller 161 of the control module 16, such that the switch 222 of said auxiliary control module 22 is able to be controlled by the controller 161 of the control module 16.

Such a configuration of the circuit for controlling the half H-bridge is advantageous as it is suitable for raising the load 1 to high impedance in the event of a fault with the controller 161 of the control module 16 in the case of the first operating mode.

Specifically, first of all, when the controller 221 of the auxiliary control module 22 of the first branch 18 is in the low state, the MOSFET transistor 222 of said auxiliary control module 22 is in the on-state, such that the electronic control circuit from FIG. 3 behaves like the electronic control circuit of FIG. 1 in the first operating mode.

Secondly, in the event of a fault with the controller 161 of the control module 16 during the first operating mode, the controller 221 of the auxiliary control module 22 of the first branch 18 is placed in the high state, such that the MOSFET transistor 222 of said auxiliary control module 22 switches to the off-state. The gate of the second MOSFET transistor 8 is thus linked to the electrical ground 4, such that the second MOSFET transistor 8 switches to the off-state. Insofar as the first MOSFET transistor 7 is itself also in the off-state, the load 1 is raised to high impedance.

In one variant embodiment of the invention, the first branch 18 and the second branch 19 each include an auxiliary control module such as described above with reference to FIGS. 2 and 3. Such a configuration is advantageous as it makes it possible to raise the load 1 to high impedance both in the first operating mode and in the second operating mode.

The invention claimed is:

1. An electronic circuit for controlling a half H-bridge, said half H-bridge including a first and a second MOSFET transistor of different respective types, with sources linked to a power supply line and to an electrical ground, respectively, and with respective drains linked to a center tap, said center tap configured to be linked to a terminal of a load, said electronic circuit being configured to switch said MOSFET transistors from an on-state to an off-state, respectively, the electronic circuit comprising:

first and second bipolar transistors of different respective types, with
emitters linked to a first node and to a second node, respectively,
collectors linked to the power supply line and to the electrical ground, respectively, and
respective bases linked to a third node, said third node being linked to a control module, for controlling said MOSFET transistors configured with a high state and a low state; and
first and second branches that are mounted in parallel with respect to one another between the gates of said MOSFET transistors, the first branch including a first diode and a first resistor, the second branch including a second diode and a second resistor
wherein the first node is linked to both the first resistor and the anode of the first diode of the first branch, said first resistor of the first branch is linked to the gate of the second MOSFET transistor, and the cathode of said first diode of the first branch is linked to the gate of the first MOSFET transistor, and
the second node is linked to both the second resistor and the cathode of the second diode of the second branch, said second resistor of the second branch is linked to the gate of the first MOSFET transistor, and the anode of said second diode of the second branch is linked to the gate of the second MOSFET transistor.

2. The electronic circuit for controlling a half H-bridge as claimed in claim 1, wherein the second branch includes a first auxiliary control module including a switch and a controller of said switch, said switch being configured to open and close the second branch between the second resistor and the second diode of said second branch, the gate of the first transistor being linked to the power supply line by a third resistor.

3. The electronic circuit for controlling a half H-bridge as claimed in claim 2, wherein the switch of the second branch is a MOSFET transistor having a drain linked to the second resistor of the second branch, a gate linked to an output of said controller of the first auxiliary control module of the second branch, and a source linked to the cathode of the second diode of the second branch.

4. The electronic circuit for controlling a half H-bridge as claimed in claim 1, wherein the first branch includes a second auxiliary control module including a switch and a controller of said switch, said switch being configured to open and close the first branch between the first resistor and the first diode of said first branch, the gate of the second transistor being linked to the electrical ground by a fourth resistor.

5. The electronic circuit for controlling a half H-bridge as claimed in claim 4, wherein the switch of the first branch is a MOSFET transistor having a drain linked to the first resistor of the first branch, a gate linked to an output of said controller of the second auxiliary control module of the first branch, and a source linked to the cathode of the first diode of the first branch.

6. The electronic circuit for controlling a half H-bridge as claimed in claim 1, wherein the collector of the first bipolar transistor is linked to the power supply line by a fifth resistor, and
the collector of the second bipolar transistor is linked to the electrical ground by a sixth resistor.

7. The electronic circuit for controlling a half H-bridge as claimed in claim 1, wherein the control module includes a controller configured to generate voltage signals, and a MOSFET transistor having a drain linked to the power supply line, a gate linked to an output of the controller, and a source linked both to said third node and to the electrical ground.

8. The electronic circuit for controlling a half H-bridge as claimed in claim 7, wherein a seventh resistor is disposed between the source of the MOSFET transistor of the control module and the electrical ground.

9. The electronic circuit for controlling a half H-bridge as claimed in claim 2, wherein the first branch includes a second auxiliary control module including a switch and a controller of said switch, said switch being configured to open and close the first branch between the first resistor and the first diode of said first branch, the gate of the second transistor being linked to the electrical ground by a fourth resistor.

10. The electronic circuit for controlling a half H-bridge as claimed in claim 3, wherein the first branch includes a second auxiliary control module including a switch and a controller of said switch, said switch being configured to open and close the first branch between the first resistor and the first diode of said first branch, the gate of the second transistor being linked to the electrical ground by a fourth resistor.

11. The electronic circuit for controlling a half H-bridge as claimed in claim 2, wherein the collector of the first bipolar transistor is linked to the power supply line by a fifth resistor, and
the collector of the second bipolar transistor is linked to the electrical ground by a sixth resistor.

12. The electronic circuit for controlling a half H-bridge as claimed in claim 3, wherein the collector of the first bipolar transistor is linked to the power supply line by a fifth resistor, and
the collector of the second bipolar transistor is linked to the electrical ground by a sixth resistor.

13. The electronic circuit for controlling a half H-bridge as claimed in claim 4 wherein the collector of the first bipolar transistor is linked to the power supply line by a fifth resistor, and
the collector of the second bipolar transistor is linked to the electrical ground by a sixth resistor.

14. The electronic circuit for controlling a half H-bridge as claimed in claim 5, wherein the collector of the first bipolar transistor is linked to the power supply line by a fifth resistor, and
the collector of the second bipolar transistor is linked to the electrical ground by a sixth resistor.

15. The electronic circuit for controlling a half H-bridge as claimed in claim 2, wherein the control module includes a controller configured to generate voltage signals, and a MOSFET transistor having a drain linked to the power supply line, a gate linked to an output of the controller, and a source linked to both said third node and the electrical ground.

16. The electronic circuit for controlling a half H-bridge as claimed in claim 3, wherein the control module includes a controller configured to generate voltage signals, and a MOSFET transistor having a drain linked to the power supply line, a gate linked to an output of the controller, and a source linked to both said third node and the electrical ground.

17. The electronic circuit for controlling a half H-bridge as claimed in claim 4, wherein the control module includes a controller configured to generate voltage signals, and a MOSFET transistor having a drain linked to the power supply line, a gate linked to an output of the controller, and a source linked to both said third node and the electrical ground.

18. The electronic circuit for controlling a half H-bridge as claimed in claim 5 wherein the control module includes a controller configured to generate voltage signals, and a MOSFET transistor having a drain linked to the power supply line, a gate linked to an output of the controller, and a source linked to both said third node and the electrical ground.

19. The electronic circuit for controlling a half H-bridge as claimed in claim 6, wherein the control module includes a controller configured to generate voltage signals, and a MOSFET transistor having a drain linked to the power supply line, a gate linked to an output of the controller, and a source linked to both said third node and the electrical ground.

20. The electronic circuit for controlling a half H-bridge as claimed in claim 14, wherein the control module includes a controller configured to generate voltage signals, and a MOSFET transistor having a drain linked to the power supply line, a gate linked to an output of the controller, and a source linked to both said third node and the electrical ground.

* * * * *